(12) United States Patent
Albers et al.

(10) Patent No.: US 10,121,726 B2
(45) Date of Patent: Nov. 6, 2018

(54) COOLER FOR SEMICONDUCTOR DEVICES

(71) Applicant: Intel IP Corporation, Santa Clara, CA (US)

(72) Inventors: Sven Albers, Regensburg (DE); Klaus Reingruber, Langquaid (DE); Andreas Wolter, Regensburg (DE); Georg Seidemann, Landshut (DE); Christian Geissler, Teugn (DE); Alexandra Atzesdorfer, Regensburg (DE); Sonja Koller, Regensburg (DE)

(73) Assignee: INTEL IP CORPORATION, Santa Clara, CA (US)

( * ) Notice: Subject to any disclaimer, the term of this patent is extended or adjusted under 35 U.S.C. 154(b) by 31 days.

(21) Appl. No.: 14/839,510

(22) Filed: Aug. 28, 2015

(65) Prior Publication Data
US 2017/0062306 A1    Mar. 2, 2017

(51) Int. Cl.
*H01L 23/373* (2006.01)
*H01L 23/36* (2006.01)
(Continued)

(52) U.S. Cl.
CPC .......... *H01L 23/3737* (2013.01); *G06F 1/203* (2013.01); *H01L 23/373* (2013.01);
(Continued)

(58) Field of Classification Search
CPC .. H01L 23/373–23/3738; H01L 23/315; H01L 23/293; H01L 23/295; H01L 23/26;
(Continued)

(56) References Cited

U.S. PATENT DOCUMENTS 7,545,644 B2 *   6/2009   Fedorov ................ H01L 23/427
                                                         165/104.21
2004/0195671 A1  10/2004  Wakiyama et al.
(Continued)

FOREIGN PATENT DOCUMENTS

WO    WO2008093294 A1    8/2008

OTHER PUBLICATIONS

International Search Report and Written Opinion dated Oct. 27, 2016 for International Application No. PCT/US2016/043892, 11 pages.

*Primary Examiner* — Steven Loke
*Assistant Examiner* — Scott Stowe
(74) *Attorney, Agent, or Firm* — Schwabe, Williamson & Wyatt, P.C.

(57) ABSTRACT

Embodiments of the present disclosure relate to a cooler for semiconductor devices. The semiconductor device may be electrically coupleable to a power source. The device may generate heat when the power source supplies power to the device during use of the device. The cooler may be coupled to one or more surfaces of the device. The cooler may include a hydrophilic material to adsorb water from ambient air. During operation of the device, the cooler may cool the device by conduction of heat away from the device to the cooler. The cooler may include water that is evaporated during use of the device to increase cooling capacity of the cooler. The cooler may be recharged with water from humidity in air when the device is not operated or operated at a lower power level. Other embodiments may be described and/or claimed.

23 Claims, 8 Drawing Sheets

(51) Int. Cl.
*G06F 1/20* (2006.01)
*H01L 23/427* (2006.01)

(52) U.S. Cl.
CPC .. *H01L 23/427* (2013.01); *H01L 2224/16225* (2013.01); *H01L 2924/15311* (2013.01)

(58) Field of Classification Search
CPC ......... H01L 23/20; H01L 23/22; H01L 23/24; H01L 23/36; H01L 23/367; H01L 23/40
See application file for complete search history.

(56) References Cited

U.S. PATENT DOCUMENTS

| | | |
|---|---|---|
| 2009/0315168 A1 | 12/2009 | Coleus et al. |
| 2010/0013072 A1 | 1/2010 | Hasegawa |
| 2012/0280382 A1* | 11/2012 | Im .................. H01L 23/3128 257/712 |
| 2013/0137219 A1 | 5/2013 | Senzai et al. |
| 2013/0299981 A1* | 11/2013 | Maohua .................. H01L 23/26 257/738 |
| 2015/0021755 A1* | 1/2015 | Hsiao .................. H01L 25/0657 257/714 |
| 2015/0348863 A1* | 12/2015 | Du .................. H01L 23/3128 257/737 |

* cited by examiner

COOLER FOR SEMICONDUCTOR DEVICES

FIELD

Embodiments of the present disclosure generally relate to the field of integrated circuits, and more particularly, to a cooler for semiconductor devices.

BACKGROUND

The growing integration of electrical devices and components with increasingly higher performance may compromise performance because of the higher amount of heat generated in a given space. This additional heat load is exacerbated by shrinking chip and package areas. Transferring, buffering, or spreading this heat away from an electronic device is mandatory to maintain performance. Mobile devices, such as cellular phones, tablets, phablets, "internet of things" devices, and similar devices, may be space limited such that the implementation of an additional cooling may be difficult with current approaches. Moreover, mechanical or electrical cooling devices (e.g. fan, peltier element, etc.) consume additional energy and, hence, reduce the time a battery will last per charge for devices using this type of cooling. Generally, cooling approaches for mobile devices may include transferring the heat via interconnects into a printed circuit board, where the heat is spread into a case of such devices, conductive heat transfer, and/or radiation heat transfer from the component backside to the surroundings. In some devices, cooling may be accomplished by use of metallic thermal enhancements (e.g. foils, heat spreader etc.) that are attached to the component backside or gap pads that bridge the air gap between component backside and surrounding. However, these approaches may not be able to adequately handle the heat load associated with newer devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
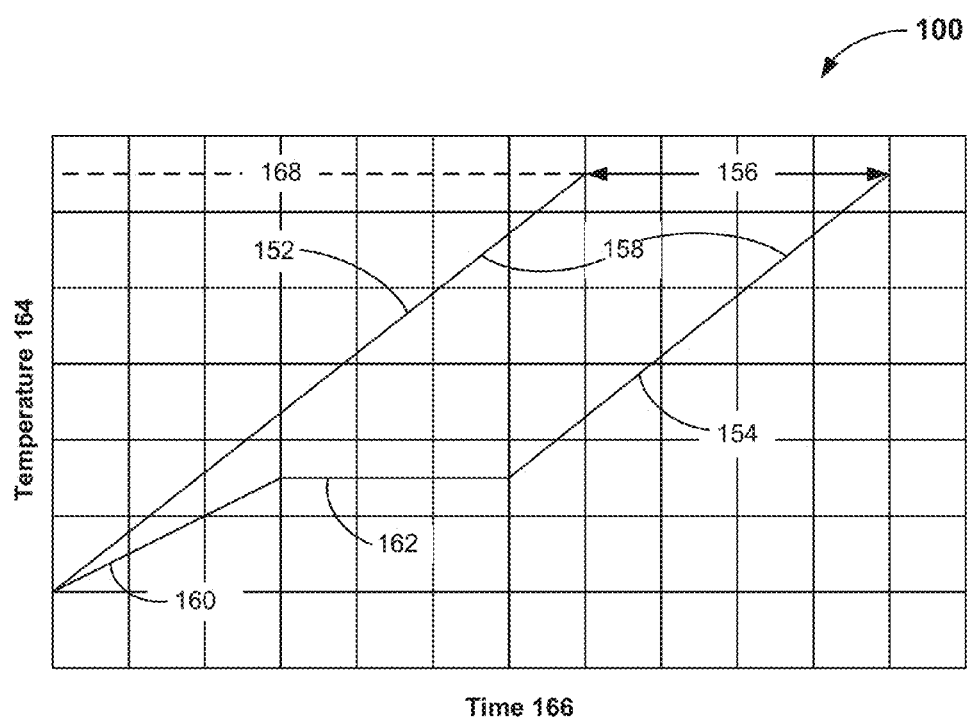
FIG. 1 schematically illustrates plot of a comparison of the temperature versus time of a device without a cooler and a device with a cooler, in accordance with some embodiments.

Embodiments of the present disclosure describe devices, apparatuses, systems, and methods related to a cooler for cooling semiconductor devices.

In the following description, various aspects of the illustrative implementations are described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact. By way of example and not limitation, "coupled" may mean two or more elements or devices are coupled by electrical connections on a printed circuit board such as a motherboard for example. By way of example and not limitation, "coupled" may mean two or more elements/ devices cooperate and/or interact through one or more network linkages such as wired and/or wireless networks. By way of example and not limitation, a computing apparatus may include two or more computing devices "coupled" by one or more network linkages.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality. As used herein, the term "die" may be used interchangeably with the term "chip".

In some embodiments, a cooler for cooling semiconductor devices ("cooler") may be used to cool various semiconductor devices, components, and/or systems without using power from a battery or other power source. The cooler may be directly or indirectly coupled to the semiconductor device. Examples of such devices, components, and/or systems, without limitation, may include a die, device, printed circuit board (PCB), package (e.g. wafer level fan out packaging (WL-FOP), Panel-FOP, wafer level chip scale packaging (WLCSP), flip chip ball grid array (FCBGA), flip chip chip scale packaging (FCCSP), and quad flat no-lead (QFN). The cooler may be coupled to a backside of a component, where the backside generally refers to the non-active side of a die or packaged die. A packaged die may include multiple dies in various configurations.

In some embodiments, the cooler may include one or more reservoirs. The reservoirs may contain a hydrophilic material. The reservoirs may contain a coolant, where the coolant is attracted to the hydrophilic material. The coolant may be water. When the coolant is water, the cooler may lose some of the water due to evaporation during higher use time periods of a component and/or system and may regain water from water vapor in air by attraction of water vapor to the hydrophilic material. Since the water vapor may recharge the reservoir, the coolant may be self-regenerating and self-refilling when the coolant is water. In some embodiments, other coolants may be used in a cooler, such as alcohols. The coolant may require a second reservoir to recharge the cooler when the coolant is not water, or the coolant may be a one-time use coolant.

In some embodiments, heat generated by the component and/or system is transferred to the cooler coupled thereto, either directly or indirectly. The amount of heat transferred may be related to the amount of use of the component and/or system. Heat generated by the component and/or system may be transferred to the cooler to lower an operating temperature of the component and/or system. A cooler coupled to a component and/or system may increase the time to reach a given temperature, such as a shutdown temperature, in comparison to a component and/or system without the cooler. A cooler with an evaporating coolant may further increase the time to reach a shutdown temperature since the heat of vaporization of the coolant increases the capacity of a cooler receive heat from a component and/or system. The amount of heat transferred and the rate of transfer from a component and/or system to a cooler may be a function of the size of the cooler, how the cooler is attached, the properties of the materials used in the cooler, the properties of a coolant, and the presence of a reservoir containing the coolant.

FIG. 1 schematically illustrates plot of a comparison of the temperature 164 versus time 166 of a device without a cooler 152 and a device with a cooler 154, in accordance with some embodiments. As illustrated, a device without a cooler 152 may have a progressive rise in temperature 164 over time 166 as the device heats up due to usage of the device. In contrast, a device with a cooler 154 may have a different slope 160 (less progressive rise) due to heat transfer from the device to the cooler. In other words, the device may increase in temperature at a slower rate because the cooler may remove heat from the device. When the cooler reaches the boiling point of a coolant included with the cooler, the temperature of the device may remain relatively constant while the coolant is evaporated 162. After the coolant has evaporated, the device with a cooler will resume increasing in temperature and may have the same rate of increase 158 in temperature as a component without a cooler 152, or may have a lower rate of increase in temperature due to the heat capacity of the cooler without the coolant. The time to reach a shutdown temperature 168 may be significantly longer for the device with the cooler 154 than a device without a cooler 152, as indicated by the time difference 156. The time to reach a shutdown temperature 168 may be more than doubled in some embodiments of a cooler.

Figure 2:
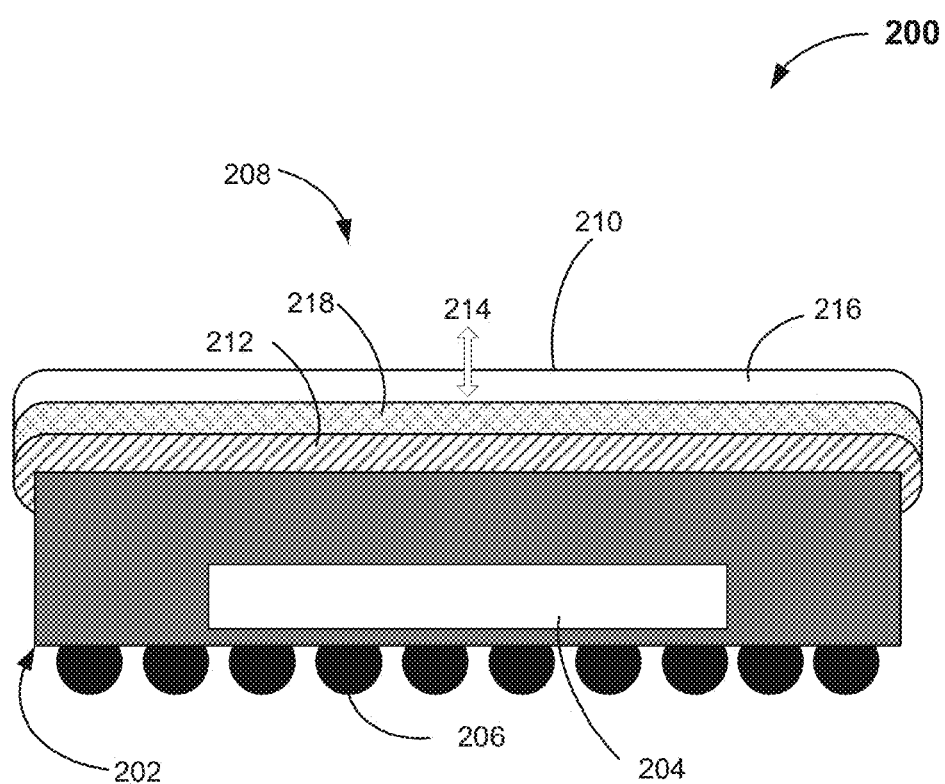
FIG. 2 schematically illustrates a cooled device with a cooler coupled to a device, in accordance with some embodiments.
Figure 4:
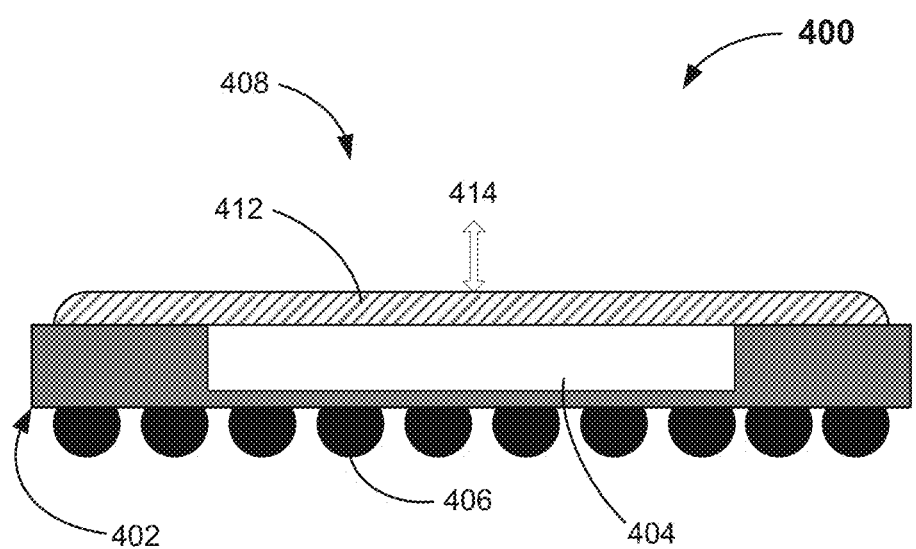
FIG. 4 schematically illustrates a cooled device with a cooler coupled to a device 402, in accordance with some embodiments.

FIG. 2 schematically illustrates a cooled device 200 with a cooler 208 coupled to a device 202, in accordance with some embodiments. In some embodiments, the cooled device 200 may include a device 202 with a die 204. The device may have one or more solder balls 206 attached thereto for coupling the device 202 to a printed circuit board (PCB) or some other type of substrate. The die 204 may include one or more dies. Device 202 may be a semiconductor package, component, and/or system, for example. In some embodiments, die 204 does not have an overmold compound on its backside and may have a backside protection tape attached to die 204. In some embodiments, the cooler 208 is attached directly to the backside protection tap attached to the backside of die 204, as illustrated in FIG. 4. In some embodiments, the cooler 208 is attached directly to the backside of die 204, as illustrated in FIG. 4. In some embodiments, an overmold may be coupled to the sides of die 204 and not the backside die 204, as illustrated in FIG. 4.

Generally, the device 202 may be any type of semiconductor device including multi-layered or stacked devices with numerous dies in a stack and bonding via wire bonding and/or flip chip bonding. In some embodiments, the device 202 may include one or more through silica vias and/or through mold vias. The device 202 may include any number of different types of substrates used in packaging including multilayer substrates with complex electrical routing features (not shown) coupling one or more dies to the solder balls 206. The solder balls 206 may be other types of contacts used to electrically couple semiconductor devices to printed circuit boards or other devices, such as contacts used in thermosonic assembly. In some embodiments, the device 202 may include a molding compound.

The cooler 208 may be directly coupled to the device 202. The cooler 208 may include a semipermeable membrane 210. Generally, the semipermeable membrane 210 may be or include a material that may prevent liquid water from passing through the membrane 210 while allowing water vapor/humidity 214 to pass through the membrane 210. The semipermeable membrane 210 may provide protection to electrical components from contamination by a hydrophilic material 212 and/or solution 218 as described below.

The semipermeable membrane 210 may be any number of membrane types and may include membranes made from polytetrafluoroethylene (PTFE), polyurethane, polyamide, aromatic polyamide, polyethersulfone, polysulfone, and/or other polymers, as well as combinations of polymers and/or other materials. The semipermeable membrane 210 may be a layered structure including one or more different types of polymers and/or coatings. In some embodiments, the cooler may have an open space 216 between the membrane 210 and the hydrophilic material 212. The cooler 208 may have different geometric shapes and may be manufactured from a variety of materials.

The cooler 208 may include a hydrophilic material 212. The hydrophilic material 212 may attract water vapor from air 214. The cooler may include a solution 218. The solution 218 may be formed by water vapor 214 passing through the membrane 210 and forming the solution 218 with the hydrophilic material 212 by dissolving a portion of the hydrophilic material 212. In some embodiments, the hydrophilic material 212 may dissolve completely in the water vapor 214 absorbed by the hydrophilic material 212. In some embodiments, the hydrophilic material 212 may have a low heat of solvation and/or crystallization to minimize heat generated by the cooler 208 during loss of water under heavier use of device 202, and uptake of water under lighter usage of device 202. In some embodiments, the hydrophilic material 212 may be non-toxic and inflammable.

In embodiments, the hydrophilic material 212 may be any number of inorganic salts including, for example sodium chloride (NaCl), calcium chloride ($CaCl_2$), calcium oxide (CaO), and/or $MgCl_2$. In some embodiments, the hydrophilic material 212 may include a mixture of one or more different inorganic salts. In some embodiments, the hydrophilic material 212 may be polyacrylic acid, hyaluronic acid, silica gel, silane, and/or urea. In other embodiments, the hydrophilic material 212 may be a polymer including hydroxyl, carboxyl, amine, and/or ionic groups. The hydrophilic material 212 may include a hydrogel. The hydrophilic material 212 may include poly(N-isopropylacrylamide) (PNIPAM), polyacrylamide (PAM), poly(2-oxazoline), polyethylenimine (PEI), poly(acrylic acid), polymethacrylate, other acrylic polymers, poly(ethylene glycol), poly(ethylene oxide), poly(vinyl alcohol) (PVA), copolymers of PVA, poly(vinylpyrrolidone) (PVP), copolymers of PVP, polyelectrolytes, cucurbit[n]uril hydrate, and/or miscellaneous hydrophilic polymers. In some embodiments, the hydrophilic material 212 may be replaced by a mixture hydrophilic materials including polymers and/or salts.

When a cooler 208 is attached to a device 202, the cooler 208 may include the hydrophilic material 212 while not including any coolant. After attachment of the cooler 208 to the device 202, the hydrophilic material 212 may attract water vapor 214 from air and may form a solution 218 prior to use of the device 202. When device 202 is operating and generating heat, the cooler 208 may draw heat away from the device 202. The cooler 208 may increase in temperature resulting in water in the cooler increasing in temperature. The temperature of the cooler 208 may increase enough due to use of device 202 to drive off the water at a boiling point. After the water is driven off, the temperature may continue to increase to a point at which device 202 may reach a shutdown temperature. The time to reach the shutdown temperature is longer when the cooler 208 is coupled to device 202 since the cooler 208 removes heat from device 202 during use. When device 202 is not being used or is not being used heavily, the heat generated is less and may allow water vapor 214 to pass back into the cooler 208 to recharge the cooler 208 with water for future cooler of device 202 during heavier use.

In some embodiments, the thickness of the cooler 208 may be 1 mm or less. In some embodiments, the thickness of the cooler 208 may be 0.5 mm or less. In some embodiments, the thickness of the cooler 208 may be approximately 0.2 mm or less. In some embodiments, the thickness of the hydrophilic material 212 may be approximately 0.3 mm or less. In some embodiments, the thickness of the hydrophilic material 212 may be approximately 0.1 mm or less.

In some embodiments, a cooler 208 may be added at different points during production of device 202. For example, the cooler 208 may be coupled to device 202 after completion of manufacturing device 202. In some embodiments, the cooler 208 may be coupled to device 202 after device 202 is coupled to a component or system, including a PCB. In some embodiments, the cooler 208 may be attached to device 202 using a glue. The glue may be a high thermally conductive glue. The glue may contain a metal such as silver or may contain metallic nano particles to enhance heat transfer through the glue to the cooler 208. The cooler 208 may be coupled to a device 202 during a standard manufacturing process. The cooler 208 may be attached directly to device 202 using a glue. The cooler 208 may be attached directly to die 204 of device 202 using a glue.

Figure 3:
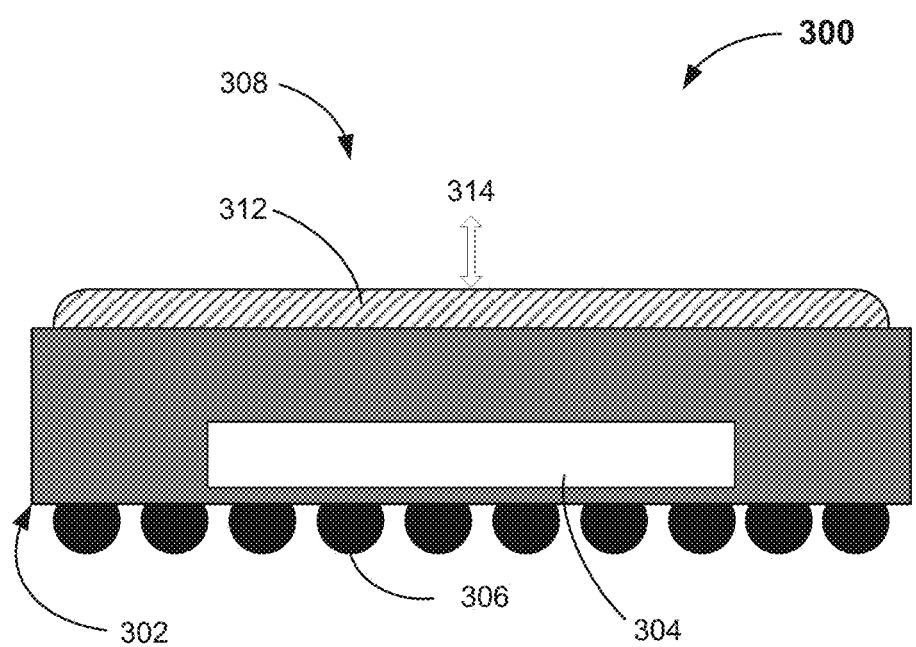
FIG. 3 schematically illustrates a cooled device with a cooler coupled to a device where the cooler includes a hydrophilic material, in accordance with some embodiments.

FIG. 3 schematically illustrates a cooled device 300 with a cooler 308 coupled to a device 302 where the cooler 308 includes a hydrophilic material 312, in accordance with some embodiments. The device 302 may include solder balls 306 and die 304, as illustrated and as described for solder balls 206 and die 204 of FIG. 2. The device 302 may be any one of the types of devices described for device 202 in FIG. 2. In embodiments, the cooler 308 may not include a membrane such as membrane 210 of FIG. 2 when the hydrophilic material does not include a salt. Device 302 may be a semiconductor package, component, and/or system, for example.

In some embodiments, die 304 does not have an overmold compound on its backside and may have a backside protection tape attached to die 304. In some embodiments, the cooler 308 is attached directly to the backside protection tap attached to the backside of die 304, as illustrated in FIG. 4. In some embodiments, the cooler 308 is attached directly to the backside of die 304, as illustrated in FIG. 4. In some embodiments, an overmold may be coupled to the sides of die 304 and not the backside die 204, as illustrated in FIG. 4.

The hydrophilic material 312 may be coupled directly to component 302 with or without glue. The hydrophilic material 312 may be a polymeric material that may be adhered directly to component 302. The hydrophilic material 312 may be similar to hydrophilic material 212 of FIG. 2. Generally, the cooler 308 may be as described for cooler 208 in FIG. 2 without membrane 210.

FIG. 4 schematically illustrates a cooled device 400 with a cooler 408 coupled to a device 402, in accordance with some embodiments. The device 402 may include solder balls 406 and die 404, as illustrated and as described for solder balls 206 and die 204 of FIG. 2. The device 402 may be any one of the types of devices described for device 202 in FIG. 2. In embodiments, the cooler 408 may not include a membrane such as membrane 210 of FIG. 2 when the hydrophilic material 412 does not include a salt. The hydrophilic material 412 may be coupled directly to component 402 with or without glue. The hydrophilic material 412 may be coupled directly to die 404, which may include more than one die as described for FIG. 2. The hydrophilic material 412 may be similar to one or more of the hydrophilic materials 212 or 312 illustrated and described in FIGS. 2 and 3. The cooler 408 may be as described for cooler 208 without membrane 212 in FIG. 2 and cooler 308 in FIG. 3. Device 402 may be a semiconductor package, component, and/or system, for example.

Figure 5:
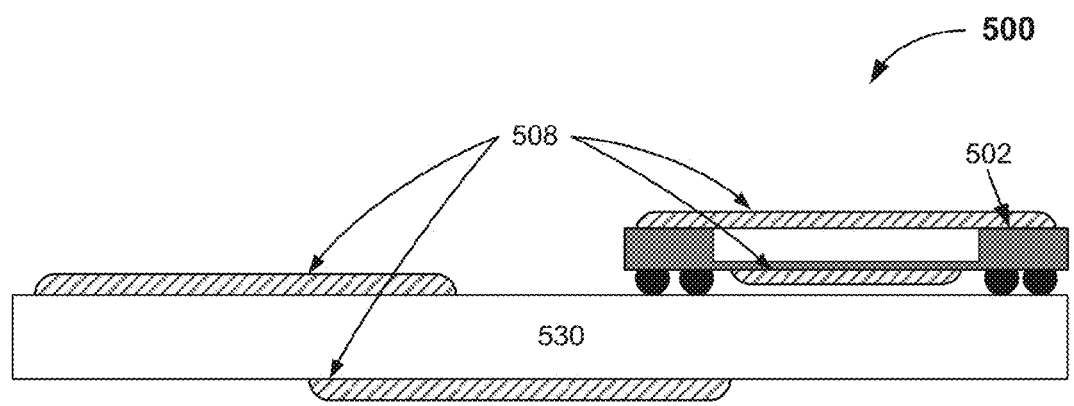
FIG. 5 schematically illustrates a cooled device with multiple coolers, in accordance with some embodiments.

FIG. 5 schematically illustrates a cooled device 500 with multiple coolers 508, in accordance with some embodiments. Cooled device 500 may include coolers 508 coupled to a printed circuit board (PCB) 530, as illustrated. Cooled device 500 may include coolers 508 coupled to a device 502 coupled to PCB 530, as illustrated. Cooler 508 may be coupled to cooled package 500 in any number of different configurations and locations to manage heat load generated during operation of the cooled package 500. Cooler 508 may be as described in FIGS. 2-4.

Figure 6:
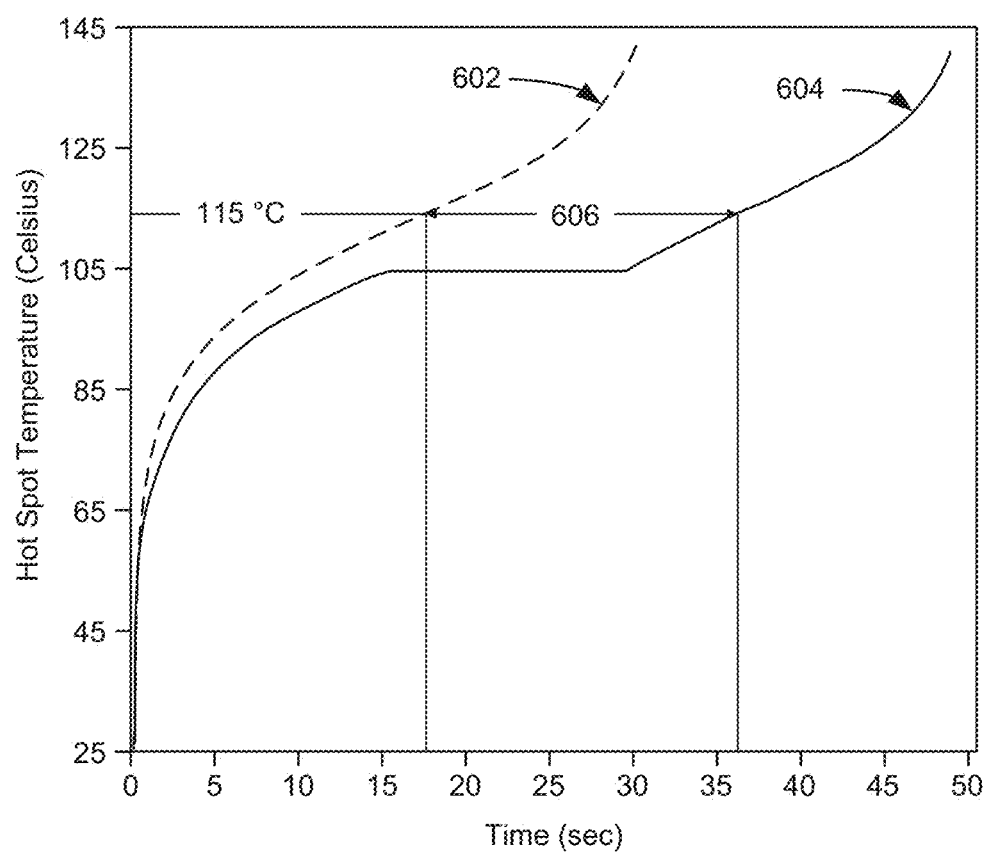
FIG. 6 schematically illustrates a simulation of the cooling effect of a cooler coupled to a processor under an exemplary high load use case, in accordance with some embodiments.

FIG. 6 schematically illustrates a simulation of the cooling effect of a cooler coupled to a processor under an exemplary high load use case, in accordance with some embodiments. Curve 602 is a simulation for a package without a cooler. Curve 604 is a simulation for a package with a cooler coupled thereto. As can be seen in FIG. 6, the rise in temperature with time is faster for the curve 602 (no cooler) as compared to the curve 604 (with cooler). At an exemplary shutdown temperature of 115° C., the distance 606 between the curves 602, 604 is approximately 19 seconds (36.5 seconds-17.5 seconds), which corresponds to about a doubling (17.5 seconds plus an additional 19 seconds due to the impact of the cooler) of the time to reach shutdown temperature.

Figure 7:
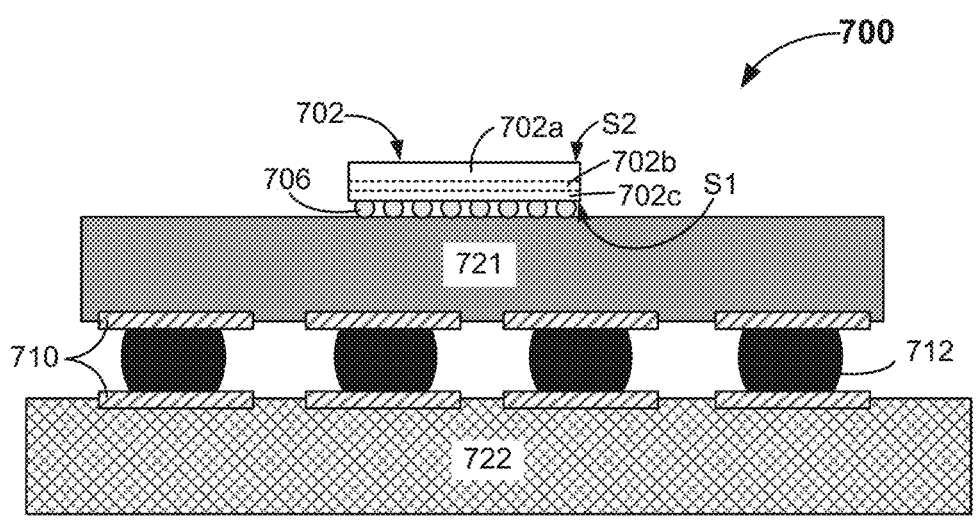
FIG. 7 schematically illustrates a cross-section side view of an integrated circuit (IC) assembly that may be cooled using one or more coolers, in accordance with some embodiments.

FIG. 7 schematically illustrates a cross-section side view of an integrated circuit (IC) assembly 700 that may be cooled using one or more coolers, in accordance with some embodiments. In some embodiments, the IC assembly 700 may include one or more dies (hereinafter "die 702") electrically and/or physically coupled with a package substrate 721. In some embodiments, the package substrate 721 may be electrically coupled with a circuit board 722, as can be seen. In some embodiments, an integrated circuit (IC) assembly 700 may include one or more of the die 702, package substrate 721 and/or circuit board 722, according to various embodiments. In some embodiments, assembly 700 may be cooled by one or more coolers coupled to die 702, substrate 721, and/or circuit board 722 in various locations as needed to remove heat generated by assembly 700. For example, a cooler may be attached to the die 702 on surface S2 and/or be attached to a molding compound encapsulating all or a portion of the die 702. As another example, a cooler may be attached to circuit board 722.

The die 702 may represent a discrete product made from a semiconductor material (e.g., silicon) using semiconductor fabrication techniques such as thin film deposition, lithography, etching and the like used in connection with forming CMOS devices. In some embodiments, the die 702 may be, include, or be a part of a processor, memory, SoC or ASIC. In some embodiments, an electrically insulative material such as, for example, molding compound or underfill material (not shown) may encapsulate at least a portion of the die 702 and/or die-level interconnect structures 706.

The die 702 can be attached to the package substrate 721 according to a wide variety of suitable configurations including, for example, being directly coupled with the package substrate 721 in a flip-chip configuration, as depicted. In the flip-chip configuration, an active side, S1, of the die 702 including circuitry is attached to a surface of the package substrate 721 using die-level interconnect structures 706 such as bumps, pillars, or other suitable structures that may also electrically couple the die 702 with the package substrate 721. The active side S1 of the die 702 may include active devices such as, for example, transistor devices. An inactive side, S2, may be disposed opposite to the active side S1, as can be seen.

The die 702 may generally include a semiconductor substrate 702a, one or more device layers (hereinafter "device layer 702b") and one or more interconnect layers (hereinafter "interconnect layer 702c"). The semiconductor substrate 702a may be substantially composed of a bulk semiconductor material such as, for example silicon, in some embodiments. The device layer 702b may represent a region where active devices such as transistor devices are formed on the semiconductor substrate. The device layer 702b may include, for example, transistor structures such as channel bodies and/or source/drain regions of transistor devices. The interconnect layer 702c may include interconnect structures (e.g., electrode terminals) that are to route electrical signals to or from the active devices in the device layer 702b. For example, the interconnect layer 702c may include horizontal lines (e.g., trenches) and/or vertical plugs (e.g., vias) or other suitable features to provide electrical routing and/or contacts.

In some embodiments, the die-level interconnect structures 706 may be electrically coupled with the interconnect layer 702c and configured to route electrical signals between the die 702 and other electrical devices. The electrical signals may include, for example, input/output (I/O) signals and/or power/ground signals that are used in connection with operation of the die 702.

In some embodiments, the package substrate 721 is an epoxy-based laminate substrate having a core and/or build-up layers such as, for example, an Ajinomoto Build-up Film (ABF) substrate. The package substrate 721 may include other suitable types of substrates in other embodiments including, for example, substrates formed from glass, ceramic, or semiconductor materials.

The package substrate 721 may include electrical routing features configured to route electrical signals to or from the die 702. The electrical routing features may include, for example, pads or traces (not shown) disposed on one or more surfaces of the package substrate 721 and/or internal routing features (not shown) such as, for example, trenches, vias or other interconnect structures to route electrical signals through the package substrate 721. For example, in some embodiments, the package substrate 721 may include electrical routing features such as pads (not shown) configured to receive the respective die-level interconnect structures 706 of the die 702.

The circuit board 722 may be a printed circuit board (PCB) composed of an electrically insulative material such as an epoxy laminate. For example, the circuit board 722 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 702 through the circuit board 722. The circuit board 722 may be composed of other suitable materials in other embodiments. In some embodiments, the circuit board 722 is a motherboard.

Package-level interconnects such as, for example, solder balls 712 may be coupled to one or more pads (hereinafter "pads 710") on the package substrate 721 and/or on the circuit board 722 to form corresponding solder joints that are configured to further route the electrical signals between the package substrate 721 and the circuit board 722. The pads 710 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 721 with the circuit board 722 may be used in other embodiments.

The IC assembly 700 may include a wide variety of other suitable configurations in other embodiments including, for example, suitable combinations of flip-chip and/or wire-bonding configurations, interposers, multi-die package configurations including system-in-package (SiP) and/or package-on-package (PoP) configurations. Other suitable techniques to route electrical signals between the die 702 and other components of the IC assembly 700 may be used in some embodiments.

Figure 8:
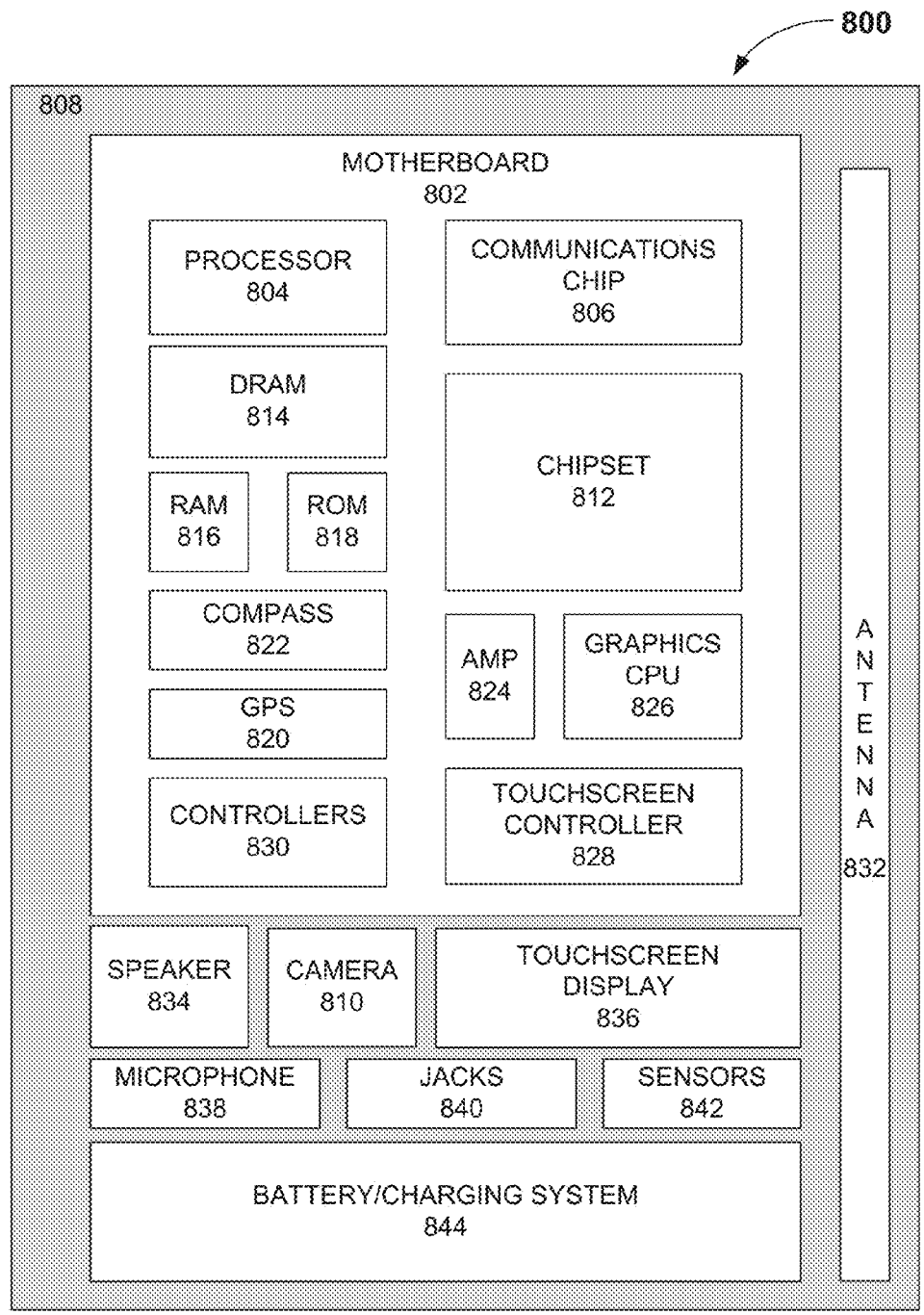
FIG. 8 schematically illustrates a computing device 900 that may include one or more coolers coupled to various components of computing device 900, in accordance with some embodiments.

Embodiments of the present disclosure may be implemented into a system using any suitable hardware and/or software to configure as desired. FIG. 8 schematically illustrates a computing device 800 that may include one or more coolers coupled to various components of computing device 800, in accordance with some embodiments. The computing device 800 may house a board such as motherboard 802 (e.g., in housing 808). The motherboard 802 may include a number of components, including but not limited to a processor 804 and a communication chip 806. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, MEMS sensors, a Geiger counter, an accelerometer, a gyroscope, a speaker, a camera, and a mass storage device (such as hard disk drive, compact disk (CD), digital versatile disk (DVD), and so forth).

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as WiGig, Wi-Fi and Bluetooth and a second communication chip 806 may be dedicated to longer range wireless communications such as GPS, EDGE, GPRS, CDMA, WiMAX, LTE, EV-DO, and others.

The term "processor" may refer to any device or portion of a device that processes electronic data from registers and/or memory to transform that electronic data into other electronic data that may be stored in registers and/or memory.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 800 may be a mobile computing device in some embodiments. In further implementations, the computing device 800 may be any other electronic device that processes data.

In various embodiments, the computing device 800 may include one or more coolers coupled to the various components described herein, including housing 808, motherboard 802, processor 804, DRAM 814, RAM 816, ROM 818, compass 822, GPS 820, controllers 830, communications chip 806, chipset 812, AMP 824, graphics CPU 826, touchscreen controller 828, speaker 834, camera 810, touchscreen display 836, microphone 838, jacks 840, sensors 842, battery/charging system 844, and/or antenna 832.

EXAMPLES

According to various embodiments, the present disclosure describes a cooler for cooling semiconductor devices.

Example 1 of a semiconductor device may comprise: a semiconductor device with a surface, wherein the device is to generate heat when a power source supplies power to the device during use of the device; and a cooler coupled to the surface of the device, wherein the cooler includes a hydrophilic material to adsorb water from ambient air.

Example 2 may include the subject matter of Example 1, and other examples herein, wherein the hydrophilic material is in direct contact with the surface of the device.

Example 3 may include the subject matter of Example 1, and other examples herein, wherein the cooler includes a semipermeable membrane coupled to the surface of the device on a perimeter of the semipermeable membrane, wherein the hydrophilic material is in direct contact with the surface of the device and is enclosed by the semipermeable membrane.

Example 4 may include the subject matter of Example 1, and other examples herein, wherein the cooler includes a semipermeable membrane, wherein the semipermeable membrane is a closed pouch that is coupled to the surface of the device and the hydrophilic material is encased inside the closed pouch.

Example 5 may include the subject matter of Example 4, and other examples herein, wherein the cooler includes an open space encapsulated in the semipermeable membrane.

Example 6 may include the subject matter of any one of Examples 3-5, and other examples herein, wherein the semipermeable membrane includes a polymer material that includes one or more of polytetrafluoroethylene, polyurethane, polyamide, aromatic polyamide, polyethersulfone, or polysulfone.

Example 7 may include the subject matter of any one of Examples 3-5, and other examples herein, wherein the semipermeable membrane is coupled to the surface by a glue.

Example 8 may include the subject matter of Example 7, and other examples herein, wherein the glue includes metal particles.

Example 9 may include the subject matter of any one of Examples 1-5, and other examples herein, wherein the hydrophilic material includes an inorganic salt or a solution of an inorganic salt.

Example 10 may include the subject matter of Example 9, and other examples herein, wherein the inorganic salt includes sodium chloride, calcium chloride, magnesium chloride, or calcium oxide.

Example 11 may include the subject matter of any one of Examples 1-5, and other examples herein, wherein the hydrophilic material includes polyacrylic acid, hyaluronic acid, silica gel, silane, or urea.

Example 12 may include the subject matter of any one of Examples 1-5, and other examples herein, wherein the hydrophilic material includes a hydrophilic polymer.

Example 13 may include the subject matter of Example 12, and other examples herein, wherein the hydrophilic polymer includes hydroxyl, carboxyl, amine, or ionic groups.

Example 14 may include the subject matter of Example 12, and other examples herein, wherein the hydrophilic polymer includes a hydrogel.

Example 15 may include the subject matter of Example 12, and other examples herein, wherein the hydrophilic polymer includes poly(N-isopropylacrylamide), polyacrylamide, poly(2-oxazoline), polyethylenimine, poly(acrylic acid), polymethacrylate, acrylic polymer, poly(ethylene glycol), poly(ethylene oxide), poly(vinyl alcohol) (PVA), copolymers of PVA, poly(vinylpyrrolidone), copolymers of PVP, polyelectrolytes, or cucurbit[n]uril hydrate.

Example 16 may include the subject matter of Example 1, and other examples herein, wherein the device is a die, a package, or a printed circuit board.

Example 17 may include the subject matter of Example 1, and other examples herein, wherein the cooler is coupled directly to a die of the semiconductor device.

Example 18 may include the subject matter of Example 17, and other examples herein, wherein the die is a processor.

Example 19 of a system may comprise: a circuit board; and a semiconductor package with a front side coupled to the circuit board, the semiconductor package including: a back side surface opposite the front side; and a cooler coupled to the back side surface of the device, wherein the cooler includes a hydrophilic material to adsorb water from ambient air, wherein the semiconductor package is to generate heat when a power source supplies power to the semiconductor package during use of the semiconductor package.

Example 20 may include the subject matter of Example 19, and other examples herein, wherein the hydrophilic material is in direct contact with the surface of the device.

Example 21 may include the subject matter of Example 19, and other examples herein, wherein the cooler includes a semipermeable membrane coupled to the surface of the device on a perimeter of the semipermeable membrane, wherein the hydrophilic material is in direct contact with the surface of the device and is enclosed by the semipermeable membrane.

Example 22 may include the subject matter of Example 19, and other examples herein, wherein the cooler includes a semipermeable membrane, wherein the semipermeable membrane is a closed pouch that is coupled to the surface of the device and the hydrophilic material is encased inside the closed pouch.

Example 23 may include the subject matter of Example 22, and other examples herein, wherein the cooler includes an open space encapsulated in the semipermeable membrane.

Example 24 may include the subject matter of any one of Examples 21-23, and other examples herein, wherein the semipermeable membrane includes a polymer material that includes one or more of polytetrafluoroethylene, polyurethane, polyamide, aromatic polyamide, polyethersulfone, or polysulfone.

Example 25 may include the subject matter of any one of Examples 21-23, and other examples herein, wherein the semipermeable membrane is coupled to the surface by a glue.

Example 26 may include the subject matter of Example 25, and other examples herein, wherein the glue includes metal particles.

Example 27 may include the subject matter of any one of Examples 20-23, and other examples herein, wherein the hydrophilic material includes an inorganic salt or a solution of an inorganic salt.

Example 28 may include the subject matter of Example 27, and other examples herein, wherein the inorganic salt includes sodium chloride, calcium chloride, magnesium chloride, or calcium oxide.

Example 29 may include the subject matter of any one of Examples 20-23, and other examples herein, wherein the hydrophilic material includes polyacrylic acid, hyaluronic acid, silica gel, silane, or urea.

Example 30 may include the subject matter of any one of Examples 20-23, and other examples herein, wherein the hydrophilic material includes a hydrophilic polymer.

Example 31 may include the subject matter of Example 30, and other examples herein, wherein the hydrophilic polymer includes hydroxyl, carboxyl, amine, or ionic groups.

Example 32 may include the subject matter of Example 30, and other examples herein, wherein the hydrophilic polymer includes a hydrogel.

Example 33 may include the subject matter of Example 30, and other examples herein, wherein the hydrophilic polymer includes poly(N-isopropylacrylamide), polyacrylamide, poly(2-oxazoline), polyethylenimine, poly(acrylic acid), polymethacrylate, acrylic polymer, poly(ethylene glycol), poly(ethylene oxide), poly(vinyl alcohol) (PVA), copolymers of PVA, poly(vinylpyrrolidone), copolymers of PVP, polyelectrolytes, or cucurbit[n]uril hydrate.

Example 34 may include the subject matter of Example 19, and other examples herein, wherein the cooler is coupled directly to a die of the semiconductor package.

Example 35 may include the subject matter of Example 34, and other examples herein, wherein, wherein the die is a processor.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments. The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize. These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a semiconductor device with a surface, wherein the device is to generate heat when a power source supplies power to the device during use of the device; and
   a cooler coupled to the surface of the device, wherein the cooler includes:
   a hydrophilic material disposed on the surface of the semiconductor device, to absorb water vapor from ambient air;
   a solution formed on top of the hydrophilic material, in response to a dissolution of at least a portion of the hydrophilic material with the water vapor; and
   a semipermeable membrane disposed above the solution to enclose the hydrophilic material and form an open space between the membrane and the hydrophilic material, wherein the semipermeable membrane prevents liquid water from passing through the semipermeable membrane and allows the water vapor to pass through the semipermeable membrane.

2. The semiconductor device of claim 1, wherein the hydrophilic material is in direct contact with the surface of the device.

3. The semiconductor device of claim 1, wherein the semipermeable membrane is coupled to the surface of the device on a perimeter of the semipermeable membrane, wherein the hydrophilic material is in direct contact with the surface of the device.

4. The semiconductor device of claim 1, wherein the semipermeable membrane is a closed pouch that is coupled to the surface of the device and the hydrophilic material is encased inside the closed pouch.

5. The semiconductor device of claim 1, wherein the semipermeable membrane includes a polymer material that includes one or more of polytetrafluoroethylene, polyurethane, polyamide, aromatic polyamide, polyethersulfone, or polysulfone.

6. The semiconductor device of claim 3, wherein the semipermeable membrane is coupled to the surface by a glue.

7. The semiconductor device of claim 6, wherein the glue includes metal particles.

8. The semiconductor device of claim 1, wherein the hydrophilic material includes an inorganic salt or a solution of an inorganic salt.

9. The semiconductor device of claim 8, wherein the inorganic salt includes sodium chloride, calcium chloride, magnesium chloride, or calcium oxide.

10. The semiconductor device of claim 1, wherein the hydrophilic material includes polyacrylic acid, hyaluronic acid, silica gel, silane, or urea.

11. The semiconductor device of claim 1, wherein the hydrophilic material includes a hydrophilic polymer.

12. The semiconductor device of claim 11, wherein the hydrophilic polymer includes hydroxyl, carboxyl, amine, or ionic groups.

13. The semiconductor device of claim 11, wherein the hydrophilic polymer includes a hydrogel.

14. The semiconductor device of claim 11, wherein the hydrophilic polymer includes poly(N-isopropylacrylamide), polyacrylamide, poly(2-oxazoline), polyethylenimine, poly(acrylic acid), polymethacrylate, acrylic polymer, poly(ethylene glycol), poly(ethylene oxide), poly(vinyl alcohol) (PVA), copolymers of PVA, poly(vinylpyrrolidone), copolymers of PVP, polyelectrolytes, or cucurbit[n]uril hydrate.

15. The semiconductor device of claim 1, wherein the device is a die, a package, or a printed circuit board.

16. The semiconductor device of claim 1, wherein the cooler is coupled directly to a die of the semiconductor device.

17. The semiconductor device of claim 16, wherein the die is a processor.

18. A system, comprising: a circuit board; and
   a semiconductor package with a front side coupled to the circuit board, the semiconductor package including:
   a back side surface opposite the front side; and
   a cooler coupled to the back side surface of the package, wherein the cooler includes a hydrophilic material disposed on the surface of the semiconductor package, to adsorb water vapor from ambient air;

a solution formed on top of the hydrophilic material in response to a dissolution of at least a portion of the hydrophilic material with the water vapor; and a semipermeable membrane disposed above the solution to enclose the hydrophilic material and form an open space between the membrane and the hydrophilic material wherein the semipermeable membrane prevents liquid water from passing through the semipermeable membrane and allows the water vapor to pass through the semipermeable membrane, wherein the semiconductor package is to generate heat when a power source supplies power to the semiconductor package during use of the semiconductor package.

19. The system of claim 18, wherein the hydrophilic material is in direct contact with the surface of the package.

20. The system of claim 18, wherein the semipermeable membrane is coupled to the surface of the package on a perimeter of the semipermeable membrane, wherein the hydrophilic material is in direct contact with the surface of the package.

21. The system of claim 18, wherein the semipermeable membrane is a closed pouch that is coupled to the surface of the package and the hydrophilic material is encased inside the closed pouch.

22. The system of claim 20, wherein the semipermeable membrane includes a polymer material that includes one or more of polytetrafluoroethylene, polyurethane, polyamide, aromatic polyamide, polyethersulfone, or polysulfone.

23. The system of claim 20, wherein the semipermeable membrane is coupled to the surface by a glue.

\* \* \* \* \*